United States Patent [19]

Hori et al.

[11] Patent Number: 5,202,586
[45] Date of Patent: Apr. 13, 1993

[54] SAMPLE-AND-HOLD CIRCUIT

[75] Inventors: Masashi Hori; Tsutomu Takayama, both of Kanagawa, Japan

[73] Assignee: Canon Kabushiki Kaisha, Tokyo, Japan

[21] Appl. No.: 792,440

[22] Filed: Nov. 15, 1991

[30] Foreign Application Priority Data

Nov. 20, 1990 [JP] Japan ................... 2-312924

[51] Int. Cl.$^5$ .................... H03K 5/153; H03F 1/30
[52] U.S. Cl. .................... 307/352; 307/358; 307/491
[58] Field of Search .............. 307/352, 353, 572, 491; 358/213.26, 98, 213.18

[56] References Cited

U.S. PATENT DOCUMENTS

| | | | |
|---|---|---|---|
| 4,446,486 | 5/1984 | Itoh | 307/358 |
| 4,785,252 | 11/1988 | Fuji et al. | 307/353 |
| 4,860,095 | 8/1989 | Kimura et al. | 358/98 |
| 4,897,857 | 1/1990 | Wakatsuki et al. | 307/358 |
| 4,963,982 | 10/1990 | Hieda | 358/213.18 |
| 4,987,321 | 1/1991 | Toohey | 307/353 |
| 5,010,408 | 4/1991 | Toohey | 307/353 |

*Primary Examiner*—Jin F. Ng
*Assistant Examiner*—Sinh Tran
*Attorney, Agent, or Firm*—Robin, Blecker, Daley & Driscoll

[57] ABSTRACT

A sample-and-hold circuit for sampling and holding a given input signal and for outputting a sampled and held signal includes a sample-and-hold processing circuit arranged to sample and hold the input signal according to a sample-and-hold clock signal, a detection circuit arranged to detect any pulse leak component included in the output of the processing circuit, and a control circuit arranged to control the phase of the sample-and-hold clock signal according to the amount of the pulse leak component detected by the detection circuit.

19 Claims, 4 Drawing Sheets

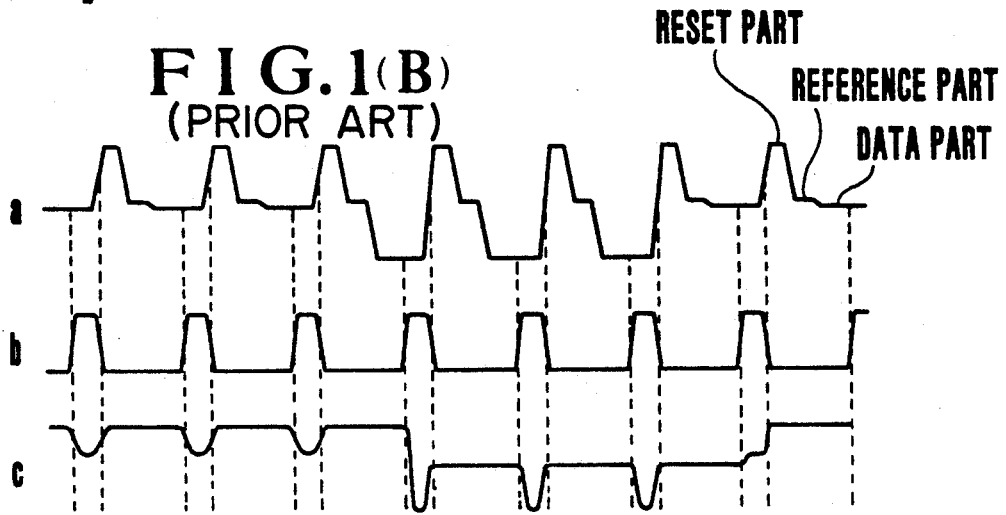
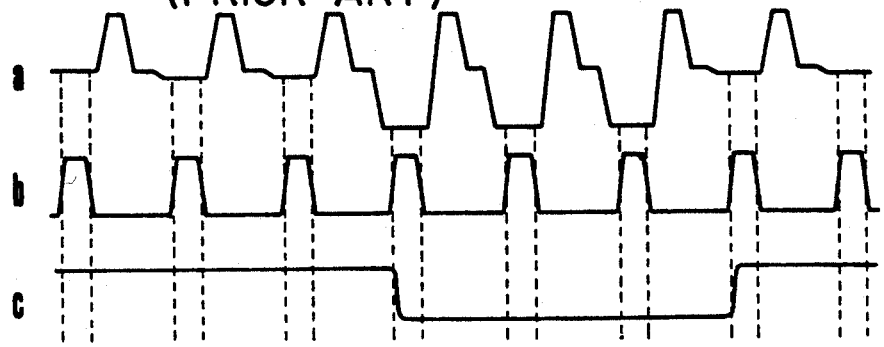

SAMPLE-AND-HOLD CIRCUIT

BACKGROUND OF THE INVENTION

1. Field of the Invention

This invention relates to a sample-and-hold circuit and more particularly to a sample-and-hold circuit arranged to sample and hold a given input signal and to output a sampled and held signal.

2. Description of the Related Art

In an image sensing device using a solid-state image sensor, information accumulated at each picture element of the solid-state image sensor (or a CCD image sensor) is arranged to be read out on a transfer clock signal as a video information signal. The signal read out from the CCD image sensor is arranged to be sampled and held in a cycle synchronized with the transfer clock signal for an ensuing signal processing operation.

However, an increase in number of the picture elements necessitates an increase in the speed of the transfer clock signal to be used for the image sensor. With the number of picture elements increased, the speed of sampling pulses to be used for sampling and holding the output of the image sensor also must be increased accordingly. As a result of the increase in the speeds of the transfer clock signal and the sampling pulses, a phase relation between output of the image sensor and the sampling pulses comes to be greatly affected even by a slight delay caused by the circuit arrangement.

FIG. 1(A) shows in outline the arrangement of the conventional sample-and-hold (hereinafter abbreviated as S/H) circuit. In FIG. 1(A), reference symbols a, b and c respectively denote an input terminal to which the output signal of the image sensor is inputted, an input terminal to which a clock signal is inputted and an output terminal. FIGS. 1(B), 1(C) and 1(D) respectively show the waveforms of the signal obtained at these terminals a, b and c at different points of phase.

As shown in FIG. 1(B), the image-sensor output signal inputted to the input terminal "a" shows a reset part, a reference part and a data part in a cycle. Among these parts, only the data part carries information as a video signal. In order that the video data is alone correctly taken out from the image-sensor output signal, the clock signal inputted to the terminal "b" must be precisely synchronized with the data part of the image-sensor output signal inputted to the terminal "a", as shown in FIG. 1(D).

If the phase relation between the input signal "a" and the clock signal "b" is deviating as shown in FIGS. 1(B) and 1(C), a pulse leak component would be generated in the output signal "c" obtained through a sample-and-hold process. The pulse leak component becomes an error signal in a subsequent signal processing action and thus comes to deteriorate picture quality. In addition to this problem, it has been another problem that the sample-and-hold output signal "c" obtained in this manner tends to bear incorrect image information, as shown in FIG. 1(B).

SUMMARY OF THE INVENTION

It is an object of this invention to provide a sample-and-hold (S/H) circuit which solves the problems mentioned above and is capable of performing an S/H action in such a manner that the quality of the picture and the precision of the image signal are never lowered by any pulse leak component.

To attain this object, a sample-and-hold circuit arranged in accordance with this invention to sample and hold a given input signal and to output a sampled and held signal comprises: sample-and-hold means for sampling and holding the input signal according to a sample-and-hold clock signal; detection means for detecting any pulse leak component included in an output of the sample-and-hold means; and control means for controlling a pulse phase of the sample-and-hold clock signal according to the quantity of the pulse leak component detected by the detection means.

The sample-and-hold circuit arranged in the above-stated manner optimizes the relation between the phase of a sampled and held signal and that of sample-and-hold clock pulses by controlling the phase of the sample-and-hold clock signal according to the quantity of the pulse leak component detected from the signal sampled and held. Therefore, information can be accurately transferred by suppressing the pulse leak component.

The above and other objects and features of the invention will become apparent from the following detailed description of embodiments thereof taken in connection with the accompanying drawings.

BRIEF DESCRIPTION OF THE DRAWINGS

FIG. 1(A) is a block diagram showing the arrangement of the conventional sample-and-hold (S/H) circuit. FIGS. 1(B), 1(C) and 1(D) are waveform charts showing the operation of an S/H circuit.

DETAILED DESCRIPTION OF THE PREFERRED EMBODIMENTS

The details of this invention are as described below with reference to the accompanying drawings which show the embodiments of the invention:

First Embodiment

Figure 2:
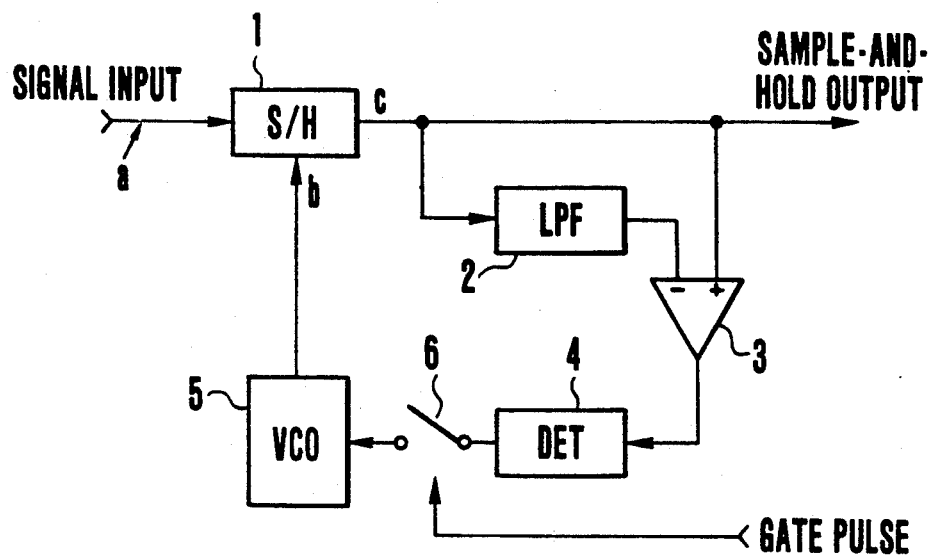
FIG. 2 is a block diagram showing an S/H circuit which is arranged according to this invention as a first embodiment of the invention.

FIG. 2 shows the arrangement of a sample-and-hold (S/H) circuit arranged as a first embodiment of this invention. In FIG. 2, reference numeral 1 denotes the S/H circuit. The S/H circuit 1 has a known internal arrangement. A signal inputted through an input terminal "a", which is, for example, a video signal outputted from a CCD image sensor, is sampled and held at the timing of a sampling pulse signal inputted from a clock terminal "b".

If the phase relation between the input signal and the sampling clock signal is deviating from a correct relation, as mentioned in the foregoing, it is impossible to obtain an accurate S/H output. In the case of this embodiment, therefore, a pulse leak component is detected from the S/H output and the phase of the sampling pulse signal is adjusted according to the amount of the pulse leak component thus detected. For detecting the pulse leak component from the S/H output, the embodiment is provided with a low-pass filter (LPF) 2 which is arranged to remove the pulse leak component, and a differential amplifier 3 which is arranged to find a difference between the output of the LPF 2 and that of the S/H circuit 1. The amount of the pulse leak component is thus detected.

A detector (DET) 4 which is of a known type is arranged to give a voltage output corresponding to the amount of the pulse leak component detected, for example, in terms of amplitude, pulse width, or the like. A voltage-controlled oscillator (VCO) 5 is arranged to generate sampling pulses. The phase of the sampling pulse signal thus obtained is controlled through the DET 4 in such a way as to lessen the pulse leak component.

A switch 6 is arranged to be turned on by a gate pulse during a period such as a horizontal blanking period during which no image information appears in the input signal in a case where the input signal is an image signal. During this period, the phase control over the sampling pulse signal is carried out. The phase of the sampling pulse signal remains unchanged while the switch 6 is in an off-state. Further, the voltage-controlled oscillator (VCO) 5 is arranged to vary the phase of the sampling pulse output according to the input voltage thereof.

The first embodiment is thus arranged to extract a pulse leak component from the output of the low-pass filter (LPF) 2 and that of the differential amplifier 3, and to form a negative feedback loop by which the phase of the sampling pulse signal is shifted according to the amount of the pulse leak component detected. This arrangement enables the embodiment to suppress the pulse leak component of the S/H output by perfectly phase-locking the S/H clock signal to the data part of the input signal, as shown in FIG. 1(D).

The data part of an input video signal coming from the CCD image sensor thus can be accurately transmitted. Therefore, the quality of picture can be prevented from deteriorating. Even in a case where an input video signal has such a high-frequency band that tends to be affected by a delay taking place through circuit elements, the embodiment is capable of easily transmitting an image signal having a high picture quality.

Second Embodiment

The first embodiment described above is arranged to use the low-pass filter and the differential amplifier in detecting the pulse leak component. In the case of a second embodiment shown in FIG. 3, however, a band-pass filter (BPF) 7 is arranged to pass only the pulse leak component. With the exception of this point, the rest of the arrangement of the second embodiment are the same as the arrangement of the first embodiment shown in FIG. 2. This arrangement enables the second embodiment to give the same advantageous effect as the first embodiment.

Third Embodiment

Figure 4:
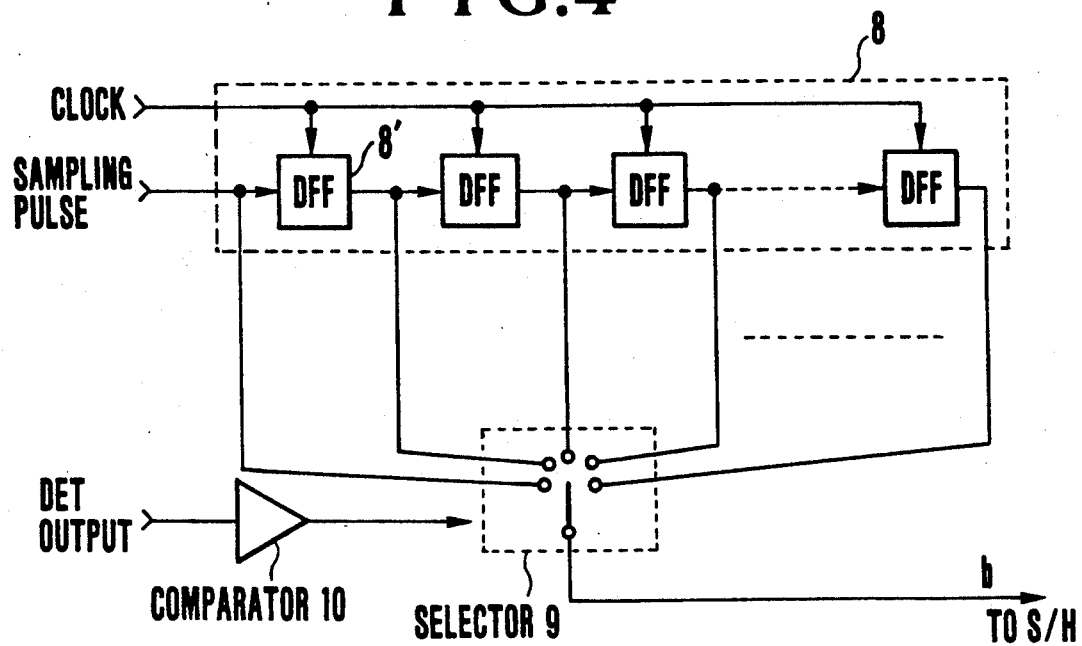
FIG. 4 is a block diagram showing the arrangement of an S/H circuit as a third embodiment of the invention.

FIG. 4 shows an example of circuit arrangement for controlling the phase of the voltage-controlled oscillator (VCO) 5 according to the amount of the pulse leak component. In the case of FIG. 4 which represents the third embodiment, a shift register 8 is employed as a means for adjusting the phase of the sampling pulse signal. The shift register 8 consists of D flip-flops 8' which are arranged in a plurality of stages. The sampling pulse signal generated by an oscillator which is not shown but is of a fixed phase type is supplied to the shift register 8 as a data signal. The shift register 8 is arranged to shift data in accordance with a shift clock signal of a frequency which is an integer times as high as the frequency of the sampling pulse signal.

A selector 9 consists of a multiplexer, etc. The phase of the sampling pulse signal can be adjusted by operating the selector 9 to select the output of one of the stages of the shift register 8.

Figure 3:
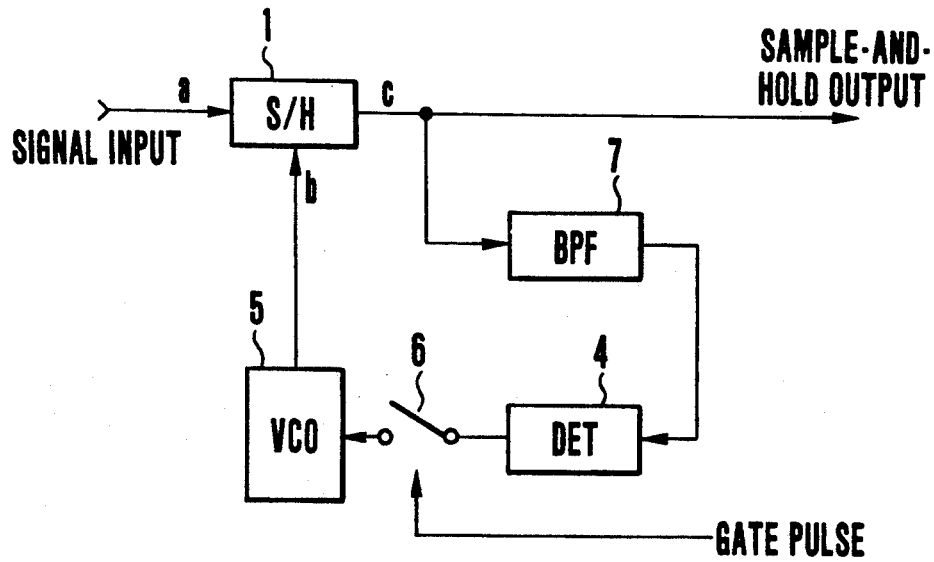
FIG. 3 is a block diagram showing the arrangement of a second embodiment of the invention.

In this case, the output of the detector (DET) 4 of FIG. 2 or FIG. 3 is evaluated by a comparator 10 which has a plurality of threshold values. In accordance with the result of evaluation, a sampling pulse signal having one of the phases of outputs of the shift register 8 is selected by the selector 9. The sampling pulse signal of the phase thus selected is inputted to the terminal "b" of the S/H circuit 1.

The above-stated arrangement enables the arrangement of FIG. 2 or FIG. 3 to adequately control the phase of the sampling pulse signal.

Fourth Embodiment

Figure 5:
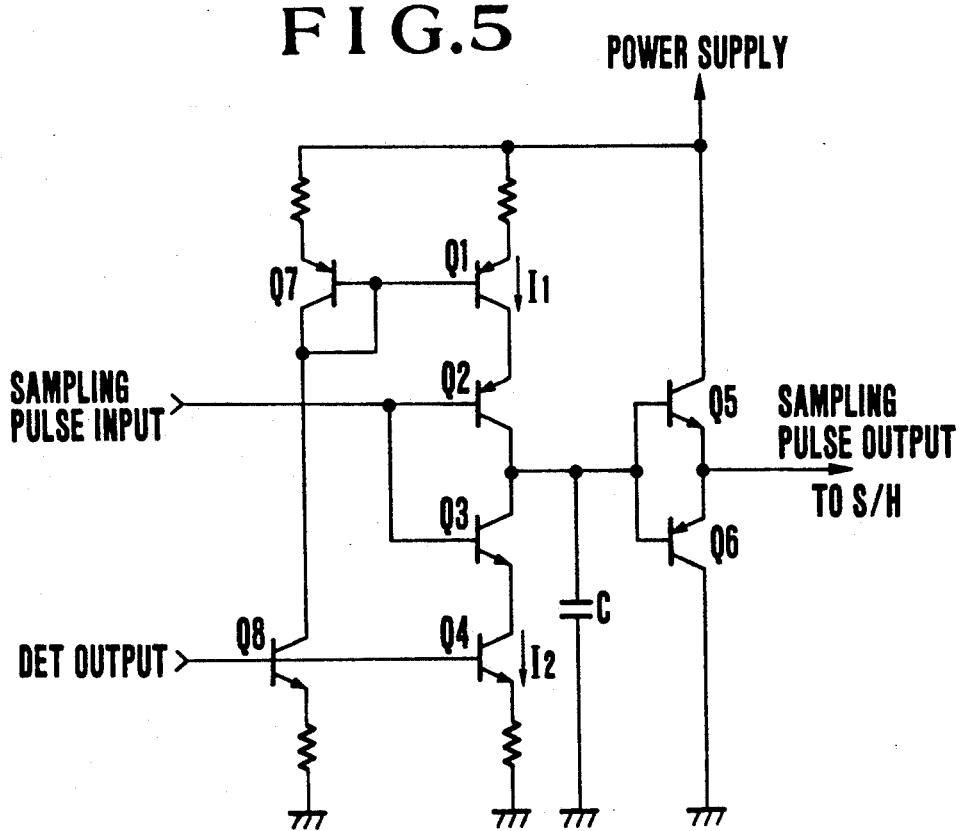
FIG. 5 is a circuit diagram showing an S/H circuit arranged as a fourth embodiment of the invention.

FIG. 5 shows, as a fourth embodiment, another example of sampling pulse phase control circuit arrangement (analog circuit). Referring to FIG. 5, a pair of PNP transistors Q1 and Q2 and a pair of NPN transistors Q3 and Q4 are respectively connected in series. These pairs are arranged to alternately become conductive in synchronism with a sampling pulse input. With the transistor pairs becoming conductive in this manner, a capacitor C is charged by the transistors Q1 and Q2 and discharged by the transistors Q3 and Q4. Then, another pair of transistors Q5 and Q6 turns on and off to give a clock pulse output in accordance with the potential of the electric charge of the capacitor C.

Further, the base potentials of the transistors Q1 and Q4 are controlled through transistors Q7 and Q8 in accordance with the output of the detector 4. By this control over the base potentials, the charging current I1 and the discharging current I2 of the capacitor C are controlled. The delay time of the pulse output thus can be controlled by varying the charge time and discharge time of the capacitor C.

Fifth Embodiment

Figure 6:
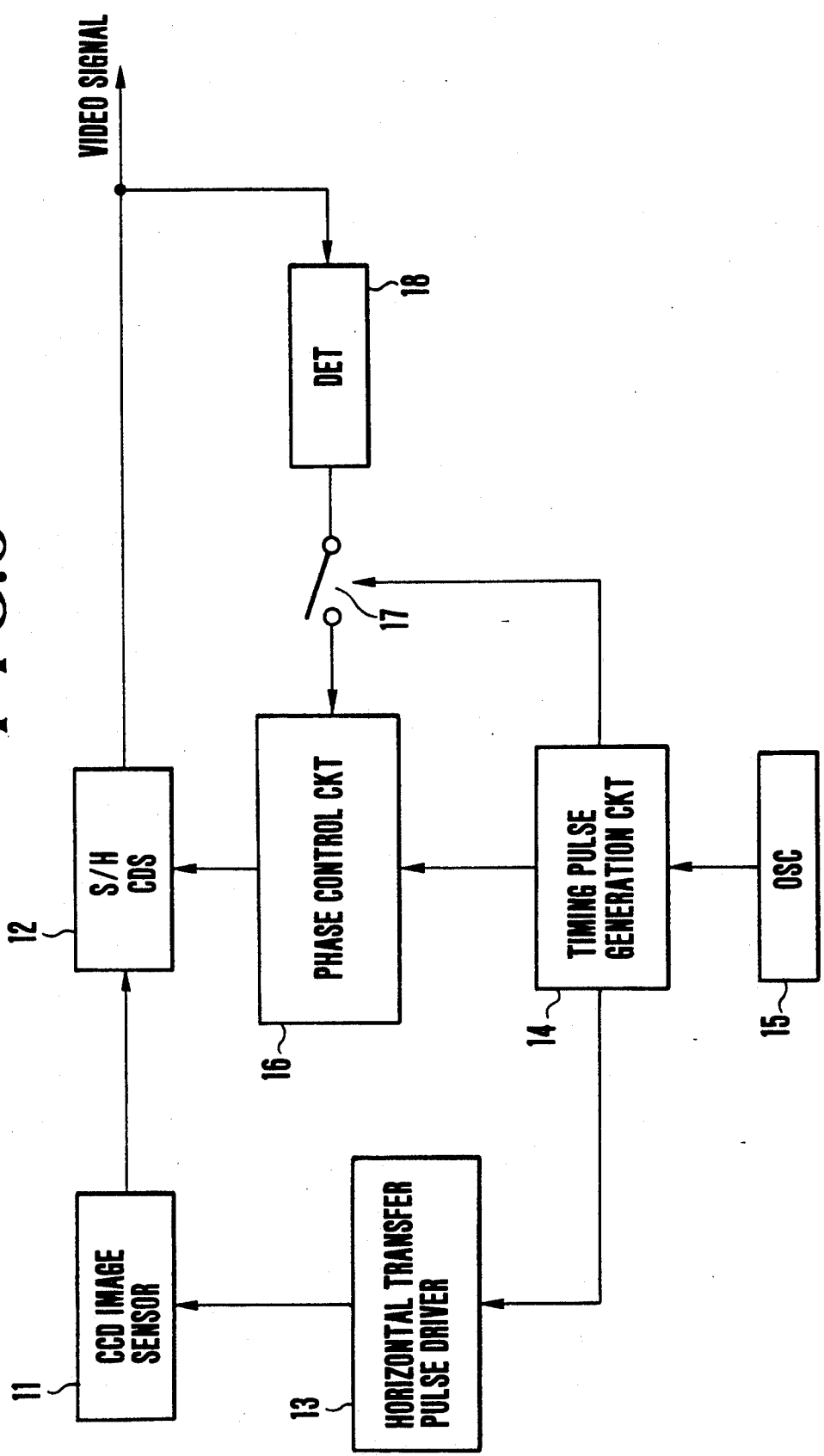
FIG. 6 is a block diagram showing an S/H circuit arranged as a fifth embodiment of the invention.

FIG. 6 shows, as a preferred embodiment of the invention, an image sensing device using a CCD image sensor. The circuit arrangement of the embodiment is shown in a broader range including the CCD image sensor.

Referring to FIG. 6, a timing pulse generation circuit 14 is arranged to generate timing pulses on the basis of clock pulses generated by an oscillator (OSC) 15 which oscillates at a fixed phase and a fixed frequency. The timing pulses generated by the timing pulse generation circuit 14 include a transfer clock pulse signal to be used for driving the CCD image sensor 11, a sample-and-hold (S/H) pulse signal, and a correlated double sampling (CDS) pulse signal.

The CCD-image-sensor driving pulse signal formed by the timing pulse generation circuit 14 is sent to a horizontal transfer pulse driver 13 to be used for driving the CCD image sensor 11. A sensed image signal formed by the CCD image sensor 11 is supplied to a S/H CDS circuit 12 to be outputted as a video signal from the S/H CDS circuit 12.

The S/H CDS circuit 12 is arranged to sample and hold the reference and data parts of the waveform "a" of the output of the CCD image sensor as shown in FIG. 1(B) and to suppress the low-frequency noise of the output of the CCD image sensor 1 by obtaining and using a difference between the signals obtained by the S/H process. In the case of this embodiment, the pulse leak component is suppressed by controlling the phase of the S/H clock signal supplied to the S/H CDS circuit 12 through a phase control circuit 16 for which the arrangement of each of the embodiments described in the foregoing is usable.

The picture elements of the CCD image sensor 11 include a part called "an optical black part" which is optically blocked. In the output of the CCD image sensor 11, a potential difference obtained between the reference part and the data part when the optical black part is read out is almost constant. Therefore, the pulse leak component generated at the S/H CDS circuit 12 is detectable by allowing the output of the S/H CDS circuit 12 obtained at the time of reading the optical black part to pass through a detector (DET) 18. For this purpose, a switch 17 is controlled to turn on according to the timing of reading out the optical black part.

The phase of the sampling pulse for the S/H CDS circuit 12 is optimized by the phase control circuit 16 according to a voltage corresponding to the amount of the pulse leak component detected by the detector 18.

While the embodiments described are arranged to process video signals, the invention is of course applicable likewise to sample-and-hold circuits which are arranged to handle information signals other than video signals.

In accordance with this invention, as described in the foregoing, the sample-and-hold circuit of the kind arranged to sample and hold a given input signal and to output a sampled and held signal comprises in combination: sample-and-hold means for sampling and holding the input signal according to a sample-and-hold clock signal; detection means for detecting any pulse leak component included in the output of the sample-and-hold means; and control means for controlling the pulse phase of the sample-and-hold clock signal according to the amount of the pulse leak component detected by the detection means. Therefore, the pulse leak component can be suppressed by detecting the pulse leak component from the signal sampled and held and by controlling the phase of the sample-and-hold clock pulse signal to optimize the phase relation between the signal to be sampled and held and the sample-and-hold pulses. The invented sample-and-hold circuit, therefore, permits information transmission with a high degree of accuracy and is capable of easily coping even with an input signal having such a high-frequency band that has heretofore presented a problem relative to a delay caused by circuit elements.

What is claimed is:

1. A sample-and-hold circuit for sampling and holding a given input signal and for outputting a sampled and held signal, comprising:
   a) sample-and-hold means for sampling and holding the input signal according to a sample-and-hold clock signal input thereto and providing an output signal;
   b) detection means for detecting presence of a pulse leak component in said output signal of said sample-and-hold means and providing a detection signal indicative of an amount of said pulse leak component; and
   c) control means responsive to said detection signal for controlling a phase of the sample-and-hold clock signal.

2. A circuit according to claim 1, wherein said detection means includes filter means for performing a filtering process on the output of said sample-and-hold means, and a differential amplifier arranged to detect a difference between the output of said sample-and-hold means and the output of said filter means.

3. A circuit according to claim 2, wherein said filter means includes a low-pass filter.

4. A circuit according to claim 1, wherein said detection means includes a band-pass filter.

5. A circuit according to claim 1, wherein said input signal includes an output of image sensing means.

6. A circuit according to claim 5, wherein said image sensing means includes a CCD.

7. A circuit according to claim 1, wherein said control means includes a shift register.

8. A sample-and-hold circuit for sampling and holding a given input signal and for outputting a sampled and held signal, comprising:
   a) a sample-and-hold means for sampling and holding said input signal;
   b) pulse generating means for generating a sampling pulse for obtaining a timing for sampling and holding said input signal in said sample-and-hold means;
   c) detecting means for detecting a specific portion of a signal outputted from said sample-and-hold means; and
   d) control means for controlling a phase of said sampling pulse in accordance with an output of said detecting means.

9. A circuit according to claim 8, wherein said detecting means includes a difference amplifier for detecting and amplifying a difference between an output signal of the sample-and-hold means and an output signal of filter means for filtering said output signal.

10. A circuit according to claim 9, wherein said filter means includes a low-pass filter.

11. A circuit according to claim 8, wherein said detecting means includes a band-pass filter.

12. A circuit according to claim 8, wherein said control means includes a shift register.

13. A circuit according to claim 8, wherein said input signal is an image pickup signal outputted from image pickup means for converting an optical image into an electrical signal.

14. A circuit according to claim 13, wherein said image pickup means includes a CCD.

15. An image pickup apparatus, comprising:
   a) image pickup means for converting an optical image into an electric signal;
   b) sample-and-hold means for sampling and holding an image data in the image signal outputted from said image pickup means;
   c) pulse generating means for generating a sampling pulse for providing a timing for sampling and holding said image data in said sample-and-hold means;
   d) detecting means for detecting a pulse leak component in a signal outputted from said sample-and-hold means; and
   e) control means for controlling a relative phase of said image signal and said sampling pulse, according to an output of said detecting means.

16. An image pickup apparatus according to claim 15, wherein said detecting means includes a difference amplifier for detecting and amplifying a difference between an output signal of the sample-and-hold means and an output signal of filter means for filtering said output signal.

17. An image pickup apparatus according to claim 16, wherein said filtering means includes a low-pass filter.

18. An image pickup apparatus according to claim 15, wherein said filtering means includes a band-pass filter.

19. An image pickup apparatus according to claim 15, wherein said control means includes a shift register.

* * * * *